US010534273B2

(12) United States Patent
Yang et al.

(10) Patent No.: US 10,534,273 B2
(45) Date of Patent: Jan. 14, 2020

(54) MULTI-METAL FILL WITH SELF-ALIGNED PATTERNING AND DIELECTRIC WITH VOIDS

(71) Applicant: Taiwan Semiconductor Manufacturing Co., Ltd., Hsinchu (TW)

(72) Inventors: Tai-I Yang, Hsinchu (TW); Wei-Chen Chu, Taichung (TW); Hsiang-Wei Liu, Tainan (TW); Shau-Lin Shue, Hsinchu (TW); Li-Lin Su, Taichung County (TW); Yung-Hsu Wu, Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 16 days.

(21) Appl. No.: 15/586,881

(22) Filed: May 4, 2017

(65) Prior Publication Data

US 2018/0164698 A1 Jun. 14, 2018

Related U.S. Application Data

(60) Provisional application No. 62/433,612, filed on Dec. 13, 2016.

(51) Int. Cl.
G03F 7/20 (2006.01)
H01L 21/768 (2006.01)
G03F 7/004 (2006.01)
G03F 7/00 (2006.01)
G03F 7/09 (2006.01)

(52) U.S. Cl.
CPC ........ *G03F 7/70633* (2013.01); *G03F 7/0035* (2013.01); *G03F 7/0043* (2013.01); *G03F 7/0047* (2013.01); *G03F 7/094* (2013.01); *G03F 7/70625* (2013.01); *H01L 21/7682* (2013.01); *H01L 21/76807* (2013.01); *H01L 21/76837* (2013.01); *H01L 21/76885* (2013.01); *H01L 21/76897* (2013.01); *H01L 21/76849* (2013.01)

(58) Field of Classification Search
None
See application file for complete search history.

(56) References Cited

U.S. PATENT DOCUMENTS

| | | | | |
|---|---|---|---|---|
| 9,502,350 | B1 * | 11/2016 | Bonilla | H01L 23/5283 |
| 2010/0270677 | A1 * | 10/2010 | Usami | H01L 21/76807 |
| | | | | 257/773 |
| 2013/0005147 | A1 * | 1/2013 | Angyal | H01L 21/31116 |
| | | | | 438/692 |
| 2014/0027908 | A1 * | 1/2014 | Tsai | H01L 21/76885 |
| | | | | 257/751 |

(Continued)

*Primary Examiner* — Nilufa Rahim
(74) *Attorney, Agent, or Firm* — Sterne, Kessler, Goldstein & Fox P.L.L.C.

(57) ABSTRACT

Photolithography overlay errors are a source of patterning defects, which contribute to low wafer yield. An interconnect formation process that employs a patterning photolithography/etch process with self-aligned interconnects is disclosed herein. The interconnection formation process, among other things, improves a photolithography overlay (OVL) margin since alignment is accomplished on a wider pattern. In addition, the patterning photolithography/etch process supports multi-metal gap fill and low-k dielectric formation with voids.

20 Claims, 12 Drawing Sheets

(56) References Cited

U.S. PATENT DOCUMENTS

2015/0179515 A1* 6/2015 Jezewski ........... H01L 21/76879
 257/774
2016/0118292 A1* 4/2016 He ..................... H01L 21/7682
 257/773

* cited by examiner

US 10,534,273 B2

MULTI-METAL FILL WITH SELF-ALIGNED PATTERNING AND DIELECTRIC WITH VOIDS

BACKGROUND

Photolithography misalignment can be responsible for patterning defects in Back End Of the Line (BEOL) metallization. Such patterning defects in BEOL can include line and vertical interconnect access (via) discontinuities, which can adversely impact product reliability and wafer yield.

BRIEF DESCRIPTION OF THE DRAWINGS

Aspects of the present disclosure are best understood from the following detailed description when read with the accompanying figures. It is noted that, in accordance with common practice in the industry, various features are not drawn to scale. In fact, the dimensions of the various features may be arbitrarily increased or reduced for clarity of discussion.

DETAILED DESCRIPTION

Figure 1:
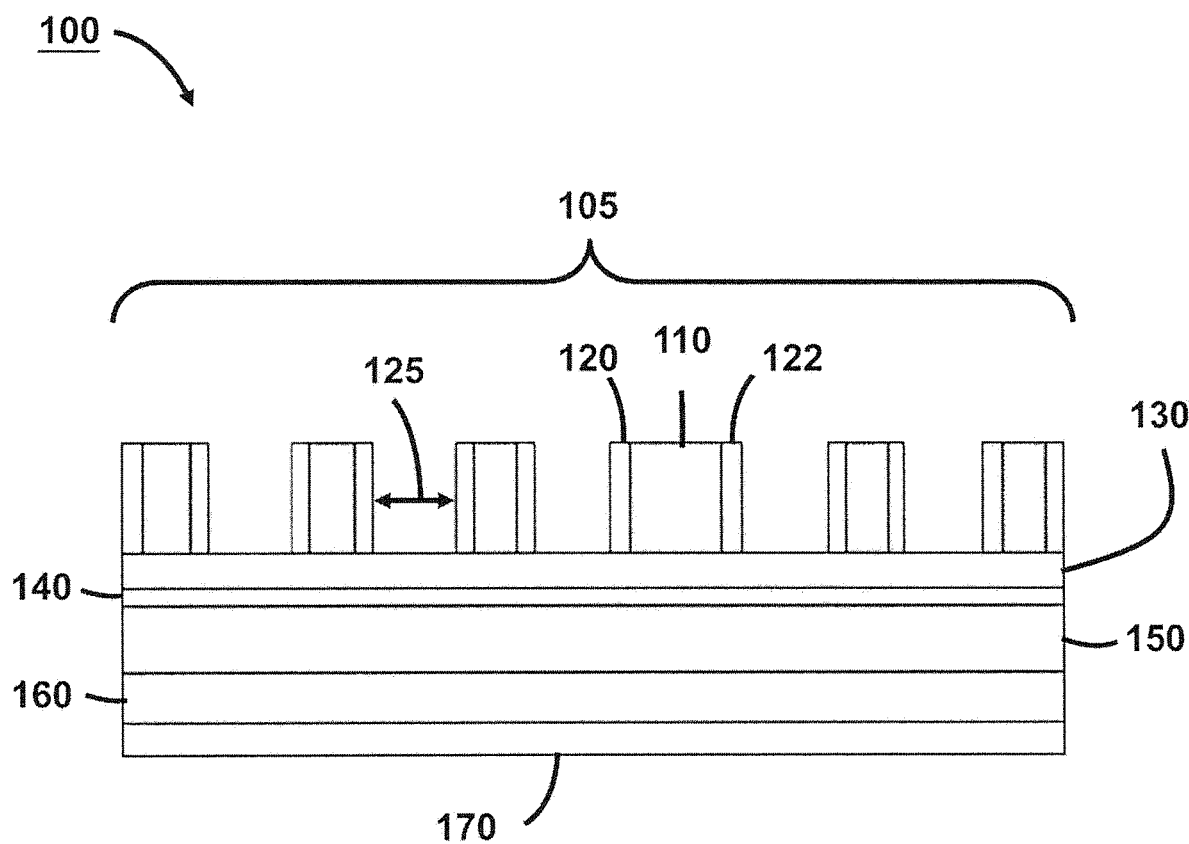
FIG. 1 is a cross-sectional view of an exemplary structure in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed that are between the first and second features, such that the first and second features are not in direct contact. In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "nominal" as used herein refers to a desired, or target, value of a characteristic or parameter for a component or a process operation, set during the design phase of a product or a process, together with a range of values above and/or below the desired value. The range of values is typically due to slight variations in manufacturing processes or tolerances.

The term "vertical," as used herein, means nominally perpendicular to the surface of a substrate.

The chip fabrication process can divided into three "modules," in which each module may include all or some of the following operations: patterning (e.g., photolithography and etch); implantation; metal and dielectric material deposition; wet or dry clean; and planarization (e.g., etch-back process or chemical mechanical planarization). The three modules can be categorized as front end of the line (FEOL), middle of the line (MOL)/middle end of the line (MEOL), and back end of the line (BEOL).

In FEOL, field effect transistors (FETs) are formed. For example, FEOL includes the formation of source/drain terminals, a gate stack, and spacers on sides of the gate stack. The source/drain terminals can be doped substrate regions formed with an implantation process after the gate stack formation. The gate stack includes a metal gate electrode, which can include two or more metal layers. The gate dielectric can include a high dielectric constant (high-k) material (e.g., greater than 3.9, which is the dielectric constant of silicon oxide). Metals in the gate electrode set the work function of the gate, in which the work functions can be different between p-type FETs and n-type FETs. The gate dielectric provides electrical isolation between the metal gate electrode and a channel formed between the source and the drain terminals when the FET is in operation.

In MOL, low level interconnects (contacts) are formed and can include two layers of contacts on top of each other. The MOL interconnects can have smaller critical dimensions (CDs; e.g., line width) and are spaced closer together compared to their BEOL counterparts. A purpose of the MOL contact layers is to electrically connect the FET terminals, i.e., the source/drain and metal gate electrode, to higher level interconnects in BEOL. A first layer of contacts in MOL, known as "trench silicide (TS)," are formed over the source and drain terminals on either side of the gate stack. In the TS configuration, the silicide is formed in the trench and after the trench formation. The silicide lowers the resistance between the source and drain regions and the metal contacts. The gate stack and the first layer of contacts are considered to be on the same "level." The second layer of contacts are formed over the gate electrode and TS. MOL contacts are embedded in a dielectric material, or a dielectric stack of materials, that ensures their electrical isolation.

In BEOL, an interlayer dielectric (ILD) is deposited over the MOL contacts. The formation of high level interconnects in BEOL involves patterning a hard mask (HM) layer and subsequently etching through the HM layer to form holes and trenches in the ILD. The ILD can be a low-k material. Low-k materials can have a dielectric constant below 3.9, which is the dielectric constant of silicon oxide ($SiO_2$). Low-k materials in BEOL can reduce unwanted parasitic capacitances and minimize resistance-capacitance (RC) delays. BEOL interconnects include two types of conductive lines: the vertical interconnect access lines (vias) and the lateral lines (lines). The vias run through the ILD layer in the vertical direction and create electrical connections to layers above or below the ILD layer. Lines are laid in the lateral direction within the ILD layer to connect a variety of components within the same ILD layer. BEOL includes multiple layers (e.g., up to 9 or more) of vias and lines with increasing CDs (e.g., line width) and line pitch. Each layer is required to align to the previous layer to ensure proper via and line connectivity.

Line connectivity can be established through an alignment between the pattern on a photomask (reticle) and existing features on a wafer surface. This quality measure is known as "overlay (OVL) accuracy." Alignment is critical because the reticle pattern must be precisely transferred to the wafer from layer to layer. Since multiple photolithography steps are used during patterning, any OVL misalignment is additive and contributes to the total placement tolerances between the different features formed on the wafer surface. The placement tolerances for each "photo-layer" are known as the "OVL budget." Each photo-layer can have a different OVL budget depending on the incoming OVL misalignment, and the size/density of the features to be transferred on the wafer's surface. Since OVL misalignments are additive, they can adversely affect the OVL budget of each photo-layer.

The wafer and the reticle position data are measured with respect to a coordinate system defined for the exposure tool and are then used in a global or field-by-field manner to perform the alignment. Global alignment, also known as "coarse alignment," can use several marks to quickly align a wafer relative to the reticle. Field-by-field alignment, also known as "fine alignment," can be used to align the reticle to each exposure site. The fine alignment can compensate for non-uniformities observed in the local topography, deposition non-uniformities, or dishing during chemical mechanical planarization (CMP) operations.

The use of a HM to form the interconnects in BEOL can have several limitations. For example, the use of a HM can limit the photolithography alignment window because the narrow patterned features present in the HM reduce the tolerance for misalignment errors. A reduction in alignment window increases the risk for overlay errors, which in turn translates to a higher probability of patterning defects on the wafer. Common patterning defects include metal bridges between vias and deformed vias or lines. Self-aligned interconnects can provide a relief to the photolithography alignment requirements and increase the alignment, or OVL, window. This is helpful for high density areas of the chip where the line pitch is small.

Various embodiments in accordance with this disclosure provide BEOL interconnect fabrication methods that employ a patterning photolithography/etch process with self-aligned interconnects resulting in a wider pattern for OVL. This effectively increases the OVL margin and reduces the number of patterning defects. Furthermore, the process is simplified because an HM layer is no longer required. According to this disclosure, the interconnect fabrication method supports the use of a multi-metal gap fill process. The metal in the multi-metal gap fill process can be a conductive material such as, for example, graphene. In some embodiments, the multi-metal gap fill interconnects are formed before the ILD layer. In some embodiments, the ILD layer is deposited such that it has naturally occurring voids to decrease the layer's dielectric constant.

FIG. 1 is a cross sectional view of a structure 100 in accordance with some embodiments. In some embodiments, structure 100 is a portion of a substrate (not shown in FIG. 1) which includes at least one BEOL interconnect network layer, in which vias and lines are formed. In some embodiments, the substrate can be a bare semiconductor wafer or a partially fabricated semiconductor wafer which includes previously formed layers. Structure 100 includes pattern structures 105, in which each pattern structure 105 includes a mandrel 110 (a center portion of pattern structure 105), a first spacer 120, and a second spacer 122. First and second spacers 120 and 122 are disposed on opposing side surfaces of mandrel 110. In some embodiments, each mandrel 110 can be made of amorphous silicon, silicon nitride or amorphous carbon. By way of example and not limitation, the thickness of mandrel 110 can range from 10 nm to about 100 nm. In some embodiments, spacers 120 and 122 can be made of titanium oxide, titanium nitride, silicon oxide, or silicon nitride. The spacer thickness can range from 5 to 50 nm depending on the design. In some embodiments, mandrels 110 and spacers 120, 122 act as an etch mask, in which a width between two pattern structures 105 is shown as distance 125.

Mandrel 110 and spacers 120, 122 are disposed over an ILD layer 130. By way of example and not limitation, ILD layer 130 has a thickness between 10 and 100 nm. In some embodiments, ILD layer 130 can be a stack of dielectrics such as, for example, a low-k dielectric and another dielectric: (i) a low-k dielectric (e.g., carbon doped silicon oxide) and a silicon carbide with nitrogen doping; (ii) a low-k dielectric and a silicon carbide with oxygen doping; (iii) a low-k dielectric with silicon nitride; or (iv) a low-k dielectric with silicon oxide.

ILD layer 130 is disposed over an etch stop layer 140. In some embodiments, etch stop layer 140 has a thickness between 1 nm and 100 nm. By way of example and not limitation, etch stop layer 140 is made of silicon carbide, silicon nitride, or silicon oxide. Structure 100 also includes an underlying metal line 150. In some embodiments metal line 150 can be part of an earlier metallization layer. Further, metal line 150 is over an ILD layer 160 and etch stop layer 170.

Figure 2:
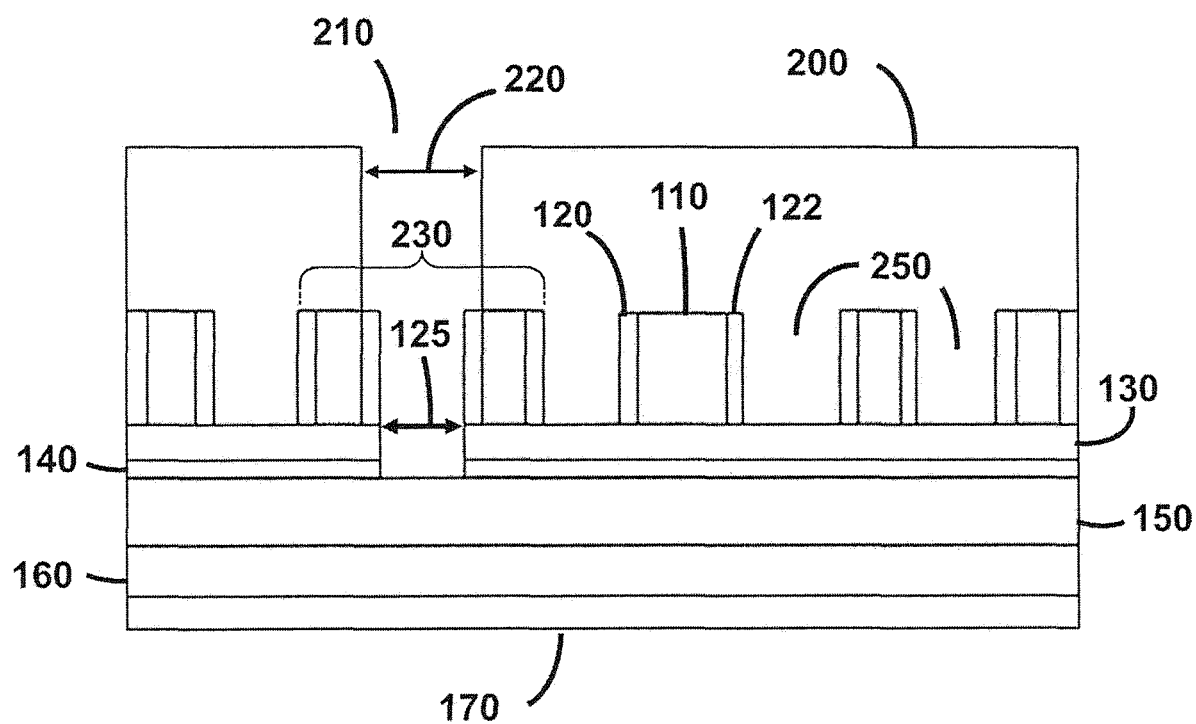
FIG. 2 shows a cross-sectional view of a structure after a layer of photoresist has been deposited and patterned, and an opening has been etched in a dielectric stack through a self-aligned etching process in accordance with some embodiments.

A photolithography operation and a series of etch operations form openings in dielectric layer 130 and etch stop layer 140. For example, in FIG. 2, a coat of photoresist 200 is photo-exposed and patterned over structure 100 to create via opening 210 that has a width 220. Photoresist 200 can be used to expose areas of structure 100 where vias will be formed and to protect other areas of structure 100 where vias should not be formed. As shown in FIG. 2, the via and line opening width can be determined by distance 125. Hence, width 220 of opening 210 may be wider than width 125. In some embodiments, opening 210 can be as wide as width 230. The scenario assumes that the OVL error in the photolithography process is zero (no alignment error), and therefore width 220 shows no variation due to the photolithography process. In some embodiments, the misalignment errors are nonzero and therefore width 220 of opening 210 can be wider than distance 125, but width 220 cannot be wider than width 230 due to the variations in the photolithography process. Therefore, the OVL error contributes to the limit as to how close width 220 can be to width 230—which is the maximum width for opening 210 without any misalignment error. In some embodiments, the OVL window is considered to be at least wider than distance 125.

An etch process removes exposed areas of ILD layer 130 and etch stop layer 140 through photoresist via opening 210 to form an opening that stops on underlying metal line 150. In some embodiments, the etch process has high selectivity for ILD layer 130 and etch stop layer 140. In some embodiments, the etch process automatically stops after a predetermined amount of time. An etch process which is terminated after a predetermined amount of time is referred to as a "timed etch." An "end-pointed" etch process is a process that automatically stops when the layer directly underneath the etched layer is detected; for example, when the underlying metal line 150 is detected. End-point detection is possible because etch stop layer 140 and the underlying layer metal line 150 are made of different materials. Consequently, they can have different etch rates for a given etching chemistry. Detection of metal line 150 can be done through, for example, a change in the etch rate, which can be detected by in-situ metrology equipment such as, for example, an optical emission microscope. Since the optical emission microscope can be integrated into the etch chamber, the etch process can be monitored in real-time. In some embodiments, the etch process may be timed for a first part of the process and end-pointed for a second part of the process. Since the etch process is required to etch different materials (e.g., ILD layer 130 and etch stop layer 140), different etch chemistry may be required. An exemplary etch chemistry can include a combination of hydrobromic acid (HBr), helium (He), oxygen ($O_2$) and chlorine ($Cl_2$). In addition to the etch chemistry, other etch process parameters can be adjusted such as, for example, flow rate, temperature, and pressure. These parameters can be used to control the etch rate, etch profile, uniformity, etc. After formation of via opening 210, photoresist 200 is removed (i.e., stripped) and line openings 250 are exposed. In some embodiments, the height of via opening 210 is larger than the height of line opening 250. In some embodiments, via and line openings 210 and 250 when filled with a conductive material form conductive structures in an interconnect layer.

Figure 3:
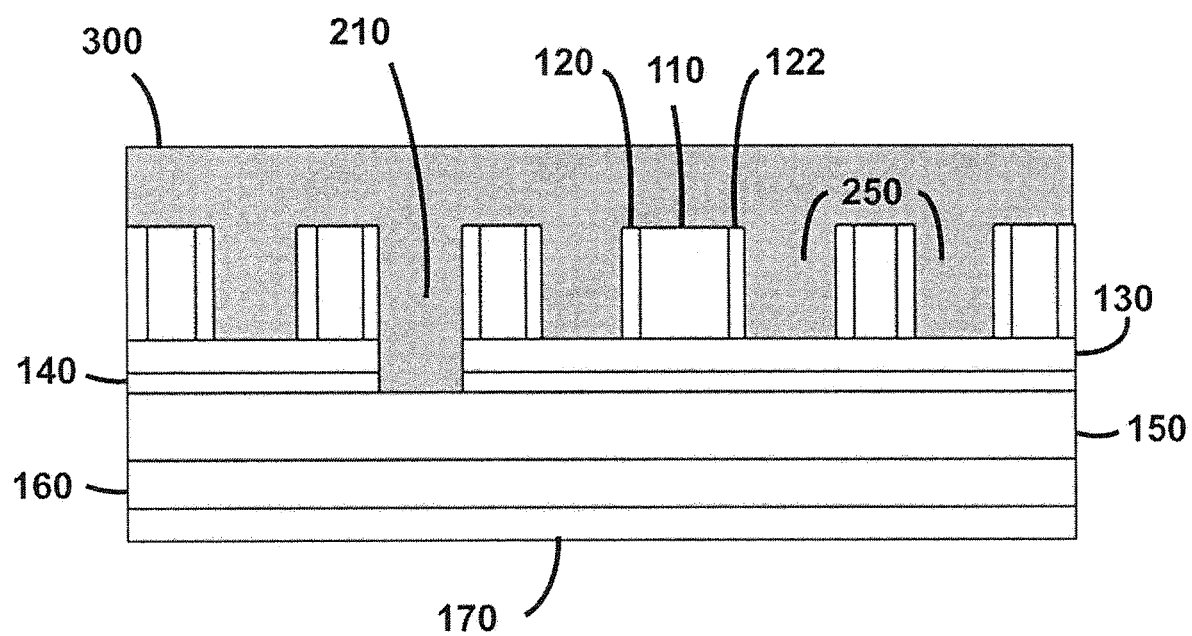
FIG. 3 shows a cross-sectional view of a structure after a conductive material fills openings in accordance with some embodiments.

FIG. 3 shows the structure of FIG. 2 after via opening 210 and line openings 250 are filled with a conductive material 300. In some embodiments, conductive material 300 is copper (Cu), cobalt (Co), aluminum (Al), graphene, or any other suitable conductive material. Conductive material 300 is polished by chemical mechanical polishing (CMP) to remove extra material (overburden) from the top of mandrels 110 and spacers 120, 122.

Figure 4:
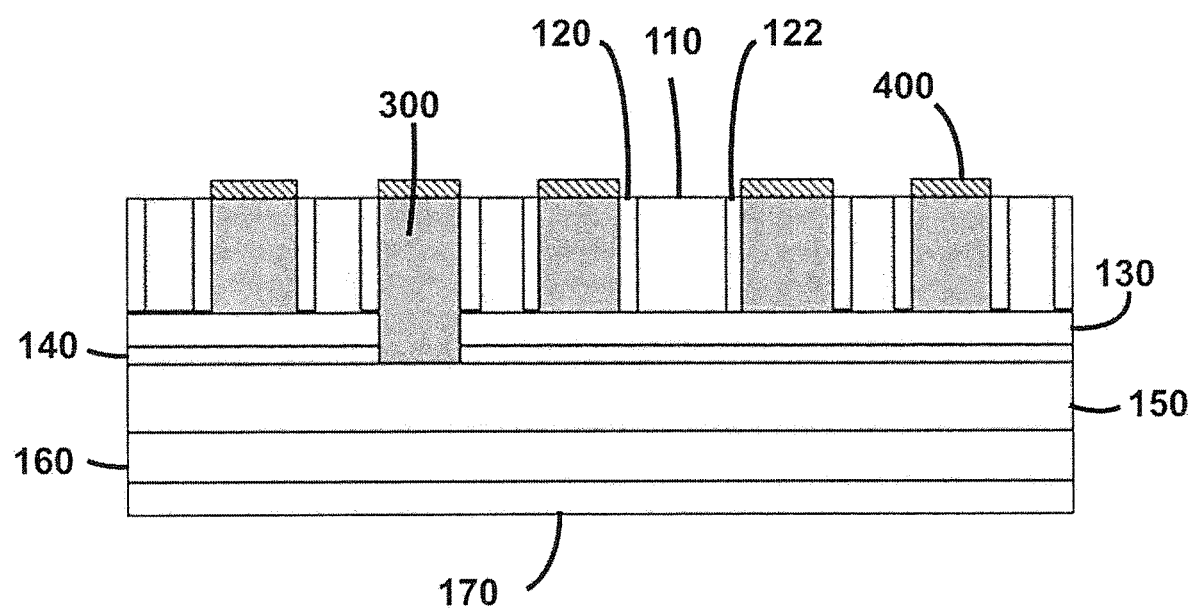
FIG. 4 shows a cross-sectional view of a structure after a metal oxide layer has been formed on conductive structures in accordance with some embodiments.

Referring to FIG. 4, once conductive material 300 is polished, a top surface of conductive material 300 is capped with an etch stop capping layer 400. In some embodiments, etch stop capping layer 400 can be selectively grown on conductive material 300. By way of example and not limitation, etch stop capping layer 400 can be a metal oxide such as, for example, an Al-based, a Co-based, a tungsten (W)-based, a nickel (Ni)-based, or a zirconium (Zr)-based oxide. Those skilled in the art will appreciate that these are merely examples and other appropriate oxides can be used. By way of example and not limitation, etch stop capping layer 400 can be deposited with chemical vapor deposition (CVD), physical vapor deposition (PVD), or a spin-on process followed by a metal oxide patterning process. The role of etch stop capping layer 400 is to protect conductive material 300 from subsequent etching processes.

Figure 5:
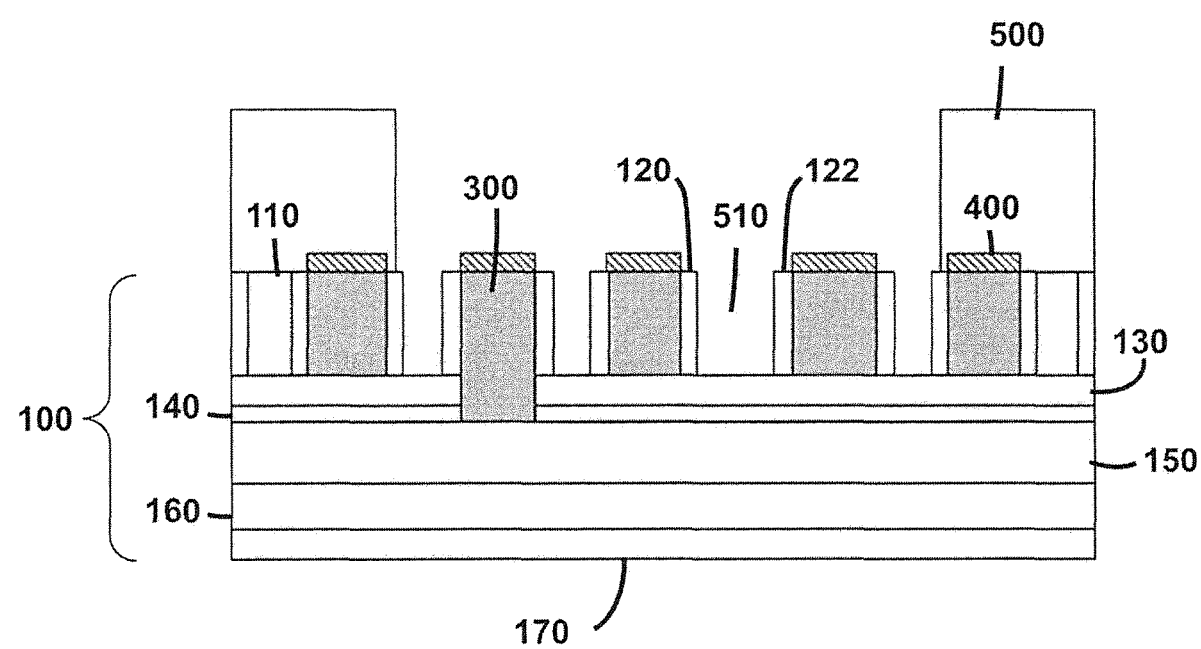
FIG. 5 shows a cross-sectional view of a structure after partial removal of patterns and a layer of photoresist has been deposited and patterned in accordance with some embodiments.

In some embodiments, additional vias and lines can be formed by removing mandrels 110 to form a plurality of openings. Respective spacers 120 and 122 associated with the mandrels 110 (to be removed) are not removed. Removal of mandrels 110 may not be global, e.g., across the whole structure 100. For example, a patterned photoresist may be used to protect areas of structure 100 where removal of mandrels 110 is not desired. In some embodiments, a dry etch chemistry can be used to remove mandrels 110. By way of example and not limitation, a dry etch chemistry can be a combination of HBr, He, $O_2$, and $Cl_2$. After the mandrel removal process, a resist strip operation removes the photoresist. FIG. 5 shows the structure of FIG. 4 after photoresist 500 is applied and patterned, and at least a portion of mandrels 110 are removed to form an opening 510 between opposing first spacer 120 and second spacer 122.

Figure 6:
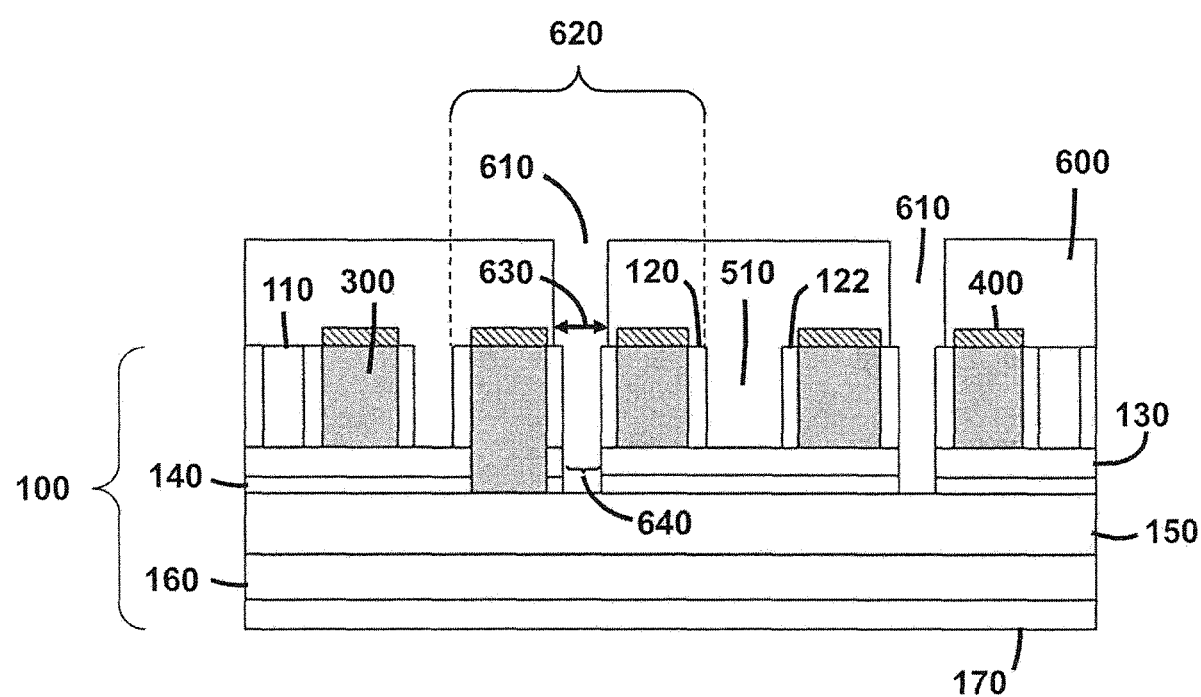
FIG. 6 shows a cross-sectional view of a structure after an opening has been etched in a dielectric stack by a self-aligned etching process in accordance with some embodiments.

In order to start the interconnect formation, a photoresist 600 is applied on structure 100, and then patterned as shown in FIG. 6. At the end of the photoresist patterning process, via openings 610 are formed in photoresist 600. Some openings, like opening 510, are covered by photoresist 600 so that they are not subjected to the etching process. During this process, the OVL window remains wide. For example, via opening 610 has a width 630. In some embodiments, in which the OVL or misalignment error is zero, via opening 610 may be as wide as width 620 for at least two reasons: (i) because the via/line opening width is defined by distance 640 between opposing spacers 120 and 122; and (ii) because metal oxide layer 400 protects conductive material 300 from the etching chemistry and therefore if width 630 is wider and includes an area where conductive material 300 is exposed, the conductive material is protected from etching. In some embodiments, the misalignment errors are nonzero and therefore width 630 of via opening 610 can be wider than distance 640, but cannot be wider than 620 due to variations in the photolithography process. Hence, the OVL error limits how close width 630 can be to width 620, which is a maximum width without any misalignment errors. This is also true for via opening 610.

Referring to FIG. 6, exposed areas of ILD layer 130 and etch stop layer 140 are etched through via openings 610 while covered areas of structure 100 are protected from the etch process. A selective process removes exposed areas of layer 130 and layer 140 to form via openings in ILD layer 130 and etch stop layer 140. In some embodiments, the etch process may be timed, end-pointed, or a combination of the two. For example, the etch process can be timed for a first part of the process and end-pointed for a second part of the process. By way of example and not limitation, the etch chemistry for the removal of ILD layer 130 may be different than the etch chemistry for etch stop layer 140. In some embodiments, the etch processes are highly selective for ILD layer 130 and etch stop layer 140. An exemplary dry etch chemistry is a combination of HBr, He, $O_2$, and $Cl_2$. Once the etch process is complete, patterned photoresist 600 is stripped and all openings, such as opening 510, are exposed. In some embodiments, opening 510 is a line opening, and the height of via opening 610 is larger than the height of line opening 510. In some embodiments, via and line openings 610 and 510 when filled with a conductive material form conductive structures in an interconnect layer.

Figure 7:
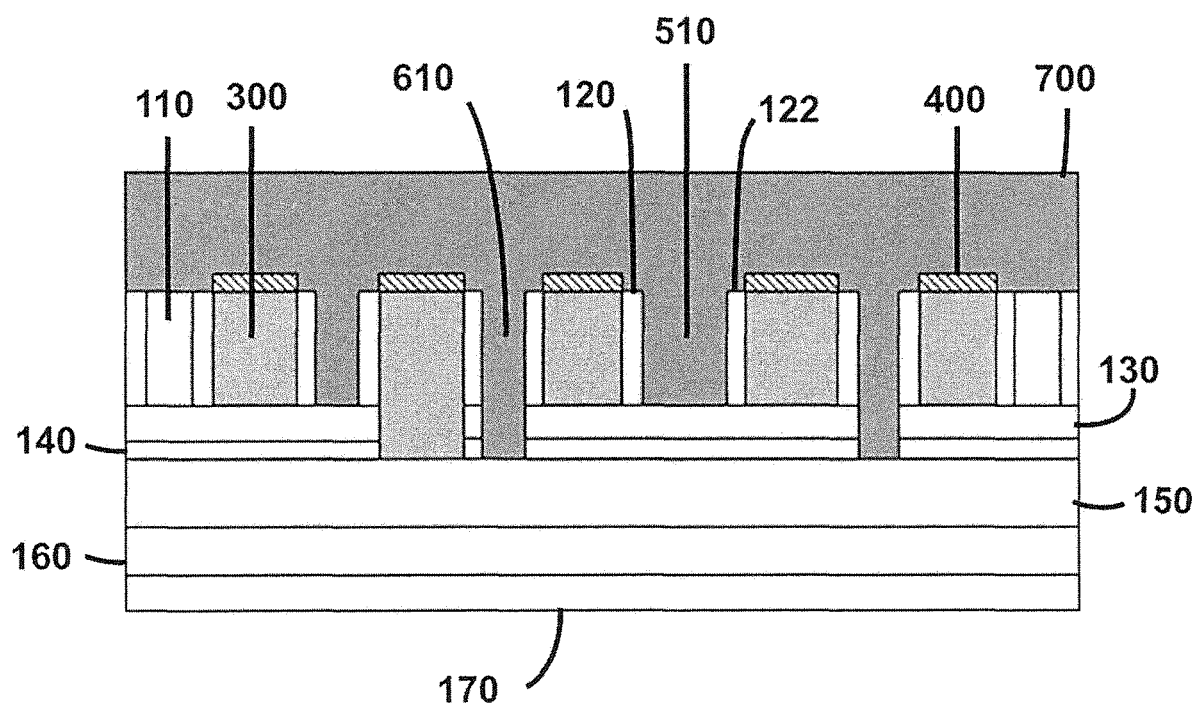
FIG. 7 shows a cross-sectional view of a structure after a conductive material fills openings in accordance with some embodiments.

In FIG. 7, a conductive material 700 fills the formed via openings (e.g., via opening 610) and line openings (e.g., opening 510). In some embodiments, conductive material 700 is different than conductive material 300. In some embodiments, conductive material 700 can be Al, Co, Cu, graphene, or any suitable conductive material with appropriate resistivity.

Figure 8:
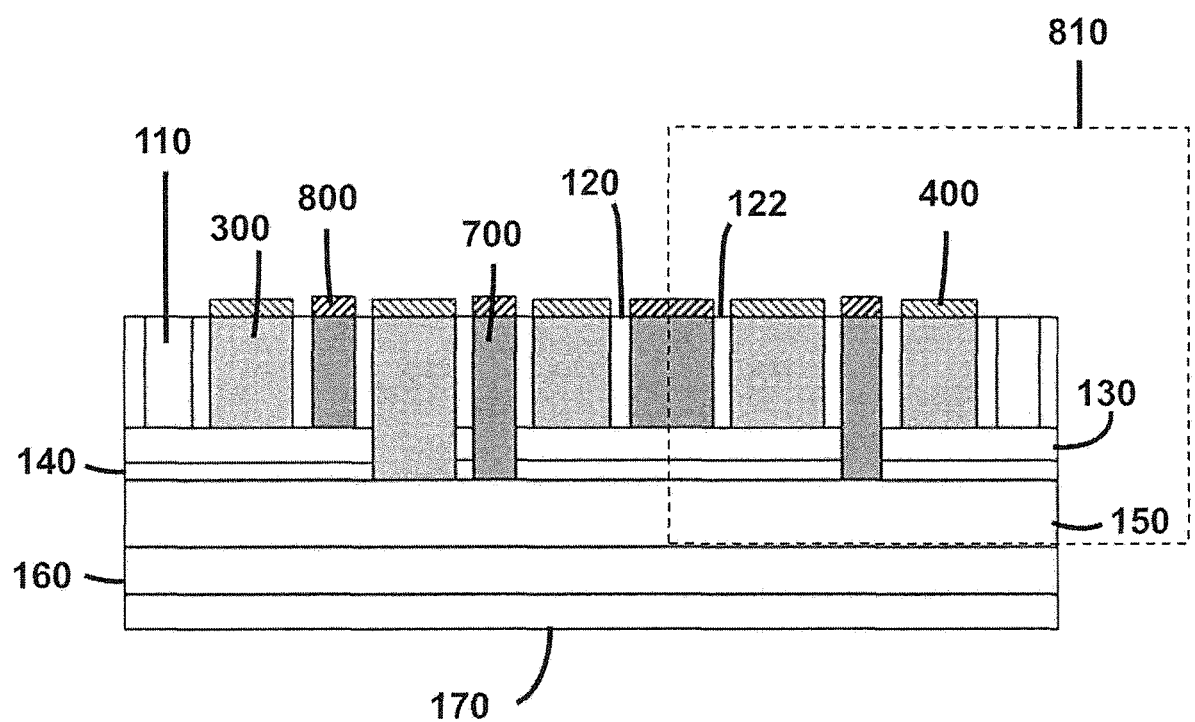
FIG. 8 shows a cross-sectional view of a structure after a metal oxide layer has been formed on conductive structures in accordance with some embodiments.

In FIG. 8, excess conductive material 700 is polished with CMP down to the level of metal oxide layer 400. In some embodiments, the excess conductive material 700 is etched with a metal etch process. In some embodiments, the excess conductive material 700 can be removed with a combination of CMP and dry etch. In the combination of CMP and dry etch case, conductive material 700 can be recessed below the metal oxide layer 400 level. Once conductive material 700 is polished, its top surface is capped with an etch stop capping layer 800. In some embodiments, lines or vias with different conductive material 300 and 700 are alternating and they may have different selectively grown etch stop capping layers. In some embodiments, similar to etch stop capping layer 400, etch stop capping layer 800 selectively grows on conductive material 700. By way of example and not limitation, etch stop capping layer 800 can be a metal oxide such as an Al-based, a Co-based, a W-based, a nickel Ni-based, or a Zr-based oxide. Those skilled in the art will appreciate that these are merely examples and other appropriate oxides can be used. By way of example and not limitation, etch stop capping layer 400 can be deposited with CVD, PVD, or a spin-on process followed by a metal oxide patterning process.

Figure 9:
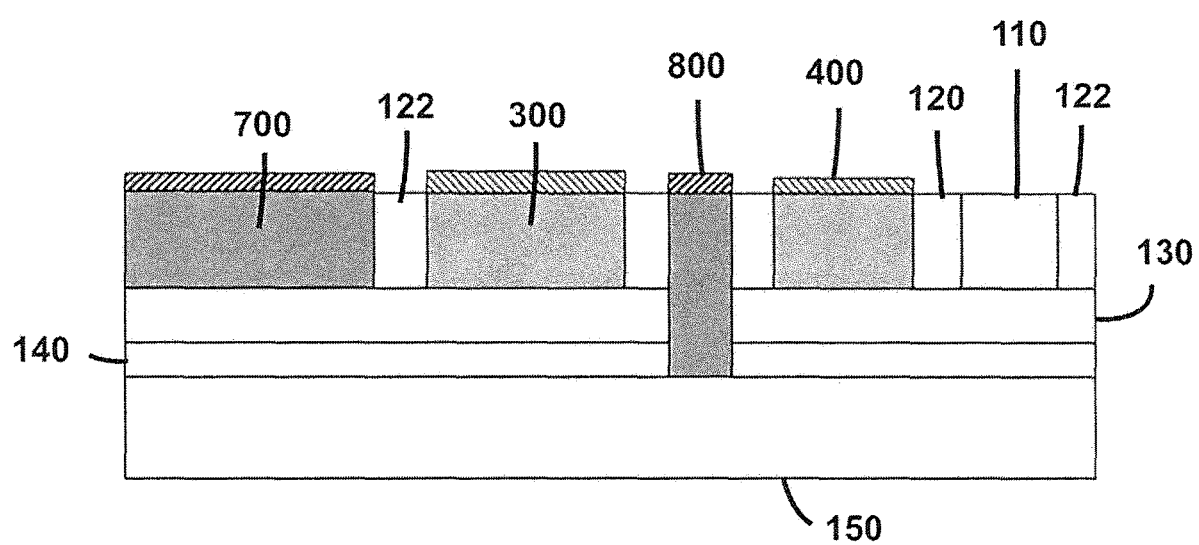
FIG. 9 shows a cross-sectional view of a magnified portion of a structure after a metal oxide layer has been formed on conductive structures in accordance with some embodiments.
Figure 10:
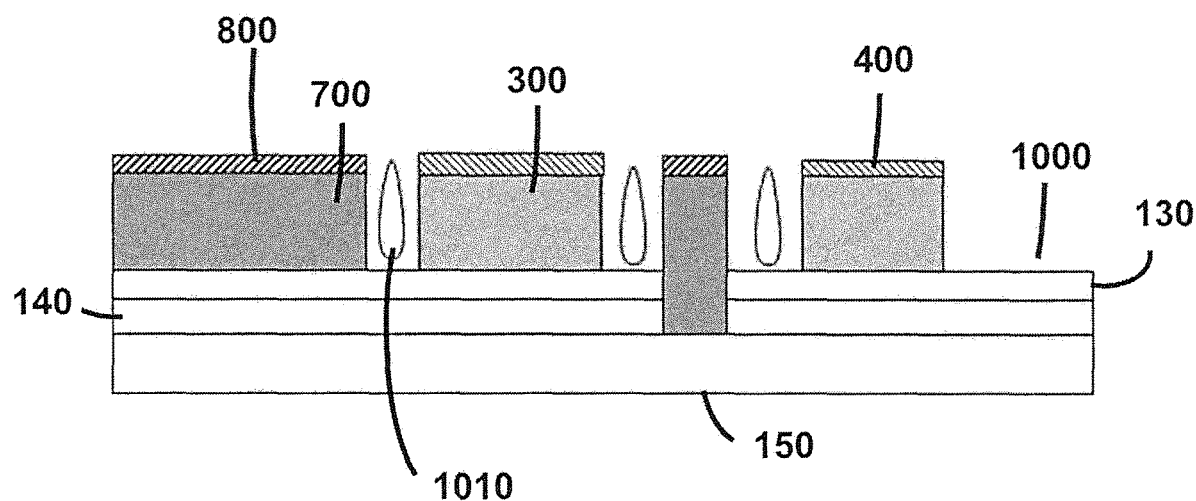
FIG. 10 shows a cross-sectional view of a structure after a first dielectric is disposed between and over the conductive structures, where the first dielectric features a void that is located between the conductive structures in accordance with some embodiments.

FIG. 9 is a magnified view of section 810 of FIG. 8. A selective etch removes the remaining first spacers 120 and second spacers 122 as well as mandrels 110 to form openings that will be filled with a dielectric liner layer. In some embodiments, spacers 120 and 122 can be removed with a dry etch process or a wet etch process. By way of example and not limitation, a dry etch chemistry can be fluorine-based ($C_xH_yF_z$) or chlorine-based ($Cl_2$, $B_xCl_y$). An exemplary wet etch chemistry can be hydrochloric acid, phosphoric acid, nitric acid and hydrogen peroxide chemistry. FIG. 10 shows FIG. 9 after the removal of remaining first spacers 120 and second spacers 122 as well as mandrel 110, and the formation of a dielectric liner layer 1000. Dielectric liner layer 1000 covers the etch stop capping layers 800, 400 and partially fills the space between the formed interconnects (line spacing) allowing for a void 1010 to be formed between the interconnects. Void 1010 may be referred to as an "air-gap." In some embodiments, void 1010 contains a gas. In some embodiments, void 1010 is nominally gas free. Voids can have a dielectric constant of nearly 1, therefore increasing the size of the void can further lower the dielectric constant of dielectric liner material 1000. In some embodiments the dielectric constant of dielectric liner layer 1000 with voids present can range from 2 to 6. In some embodiments, dielectric liner layer 1000 is deposited using a chemical vapor deposition (CVD) or an atomic layer deposition (ALD) process. The deposition process conditions and the line spacing between conductive materials 700 and 300 can modulate the size of the void. For example, process conditions such as pressure and gas ratios can affect the conformality of the deposited film and allow the void to be formed. In some embodiments, the line spacing can range from 5 to 20 nm. At this line spacing range, the void forms naturally and can occupy from 30 to 70% of the total volume between conductive materials 700 and 300. By way of example and not limitation, dielectric liner layer 1000 can be $SiO_2$, SiN, or SiC and its thickness can range from 10 to 100 nm. Due to voids 1010 present in dielectric liner layer 1000, dielectric liner layer 1000 may not have the thermo-mechanical rigidity to sustain vibrations or mechanical/thermal stress from subsequent processing. In some embodiments, a dielectric liner layer cap is formed to protect dielectric liner layer 1000 from fracture and/or collapse.

Figure 11:
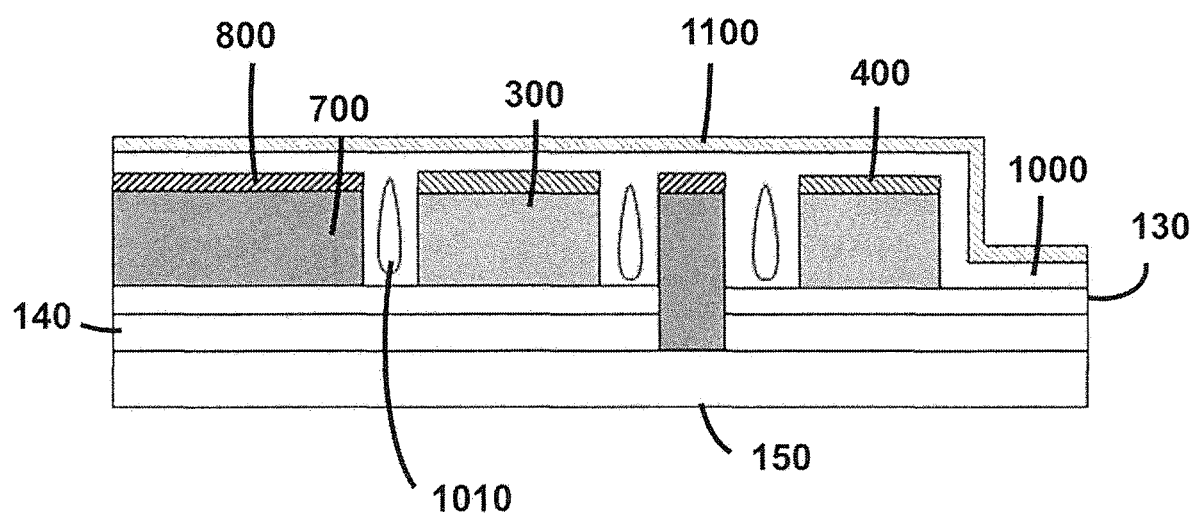
FIG. 11 a cross-sectional view of an exemplary interconnect structure in accordance with some embodiments accordance with some embodiments.

Referring to FIG. 11, a dielectric layer cap 1100 is spin-coated or deposited with CVD over dielectric liner layer 1000. In some embodiments, dielectric layer cap 1100 is a low-k layer that provides mechanical support to dielectric liner layer 1000. In some embodiments, the thickness of dielectric liner layer 1000 can range between 10 and 100 nm. In some embodiments, the dielectric constant of dielectric liner layer 1000 can range from 2 to 6.

Figure 12:
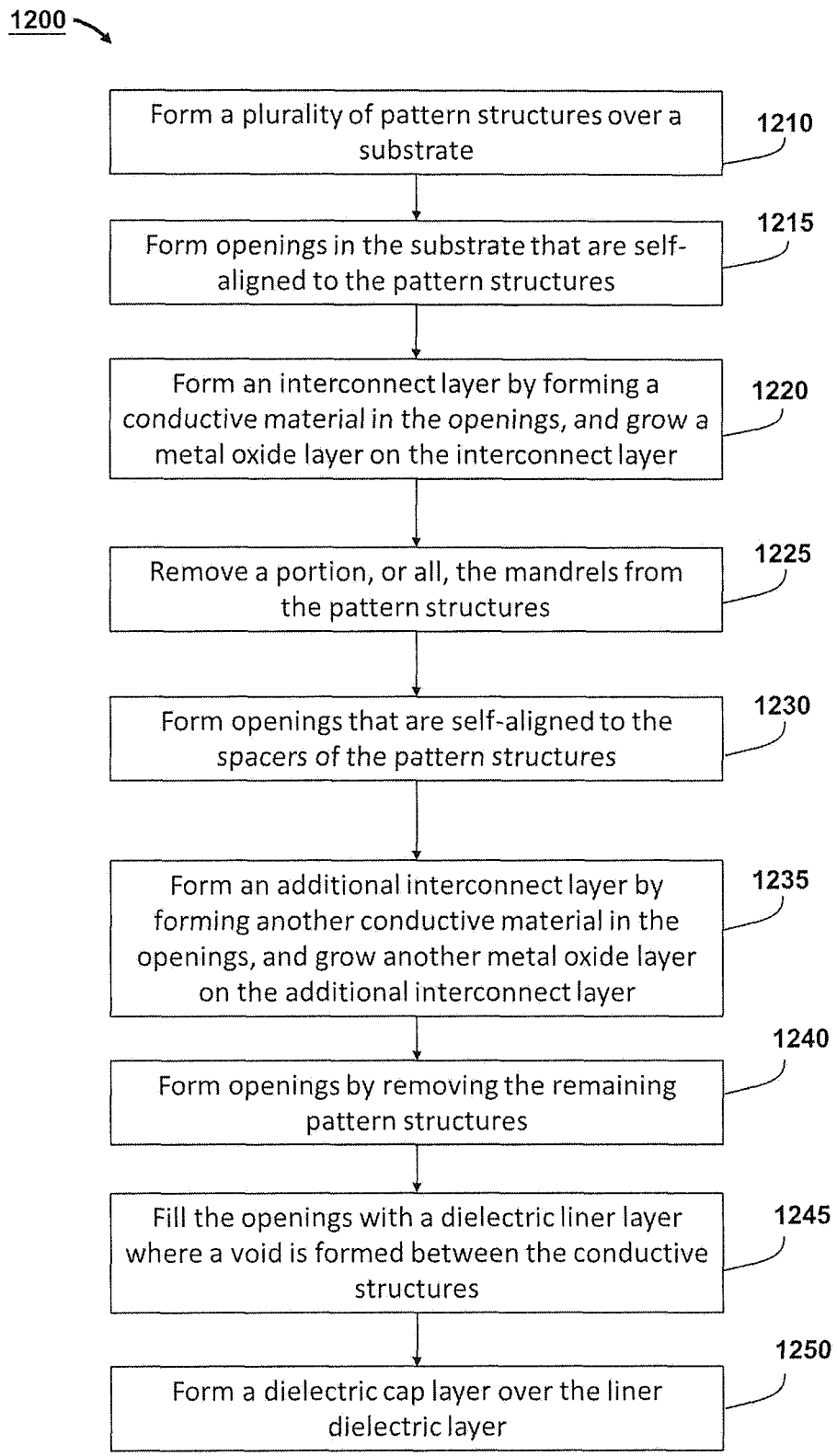
FIG. 12 is a flow diagram of an exemplary patterning fabrication method of multi-metal fill, self-aligned interconnects with dielectric liner layer and dielectric layer cap in accordance with this disclosure.

Referring to FIG. 12, a flow diagram of an exemplary patterning fabrication process 1200 of multi-metal fill, self-aligned interconnects with dielectric liner layer and dielectric layer cap in accordance with this disclosure is shown. Other fabrication operations may be performed between the various operations of method 1200, and are omitted merely for clarity. The patterning fabrication process of multi-metal fill, self-aligned metal lines with dielectric liner layer and dielectric layer cap is not limited to the exemplary fabrication process 1200.

Exemplary process 1200 starts with operation 1210, where a plurality of pattern structures are formed over a substrate such as, for example, as shown in FIG. 1. By way of example and not limitation, the substrate may be a partially fabricated wafer which includes previously formed layers. Each pattern includes a mandrel 110 (center portion) and a corresponding pair of opposing spacers 120 and 122. An exemplary substrate includes an ILD layer 130, an etch stop layer 140, and an underlying metal line 150. Metal line 150 is over ILD layer 160 and etch stop layer 170 as shown in FIG. 1. Other layers may be present below etch stop layer 170 but are not shown for clarity. In some embodiments, mandrel 110 is made of amorphous Si. In some embodiments, first and second spacers 120 and 122 respectively are made of titanium oxide or silicon nitride. In some embodiments, mandrel 110 and spacers 120, 122 act as an etch mask so that formed vias and lines are self-aligned to second spacer 122 of a first mandrel 110 and first spacer 120 of a neighboring second mandrel 110. By way of example and not limitation, ILD layer 130 has a thickness between 10 and 100 nm. In some embodiments, ILD layer 130 can be a stack of dielectrics such as a low-k dielectric and another dielectric: (i) a low-k dielectric (e.g., carbon doped silicon oxide) and a silicon carbide with nitrogen doping; (ii) a low-k dielectric and a silicon carbide with oxygen doping; (iii) a low-k dielectric with silicon nitride; or (iv) a low-k dielectric with silicon oxide.

Exemplary process 1200 continues with operation 1215, where first openings are formed in the substrate and are self-aligned to the pattern structures. Referring to FIG. 1, the opening includes via openings in ILD layer 130 and etch stop layer 140. Vias electrically connect two layers in the vertical direction, and lines make electrical connections within the same layer in a plane that is substantially parallel to the surface of the substrate. Operation 1215 involves several photolithography and etch operations. Referring to FIG. 2, a photoresist layer 200 is coated, photo-exposed, and patterned over structure 100 to create opening 210 with width 220. A subsequent etch process removes exposed areas of ILD layer 130 and etch stop layer 140 through photoresist opening 210 to from a via opening that stops on underlying metal line 150. The etch process can have high selectivity for ILD layer 130 and etch stop layer 140. An exemplary etch chemistry can include a combination of HBr, He, $O_2$, and $Cl_2$. In some embodiments, the etch process automatically stops after a predetermined amount of time. In some embodiments, the etch process may be timed for a first part of the process and end-pointed for a second part of the process.

In operation 1220, a first conductive material is disposed in the openings to form an interconnect layer that includes conductive structures. The conductive material extends upwardly from the first opening to substantially fill a region between the second spacer of a first structure and the first spacer of a neighboring second structure. Referring to FIG. 3, conductive material 300 fills via openings 210 (formed in previous operation 1215) and line openings 250. In some embodiments, the height of via opening 210 is larger than the height of line opening 250. In some embodiments, via and line openings 210 and 250 when filled with a conductive material form conductive structures in an interconnect layer. In some embodiments, conductive material 300 is Cu, Co, Al, graphene, or any other suitable conductive material. Conductive line 300 is then polished to the level of structure 110 and spacers 120/122 with a CMP process.

After the CMP process, a metal oxide layer is selectively grown on the conductive structures. The metal oxide layer is an etch stop capping layer such as, for example, layer 400 in FIG. 4. By way of example and not limitation, etch stop capping layer 400 can be a metal oxide such as an Al-based, a Co-based, a W-based, a Ni-based, or a Zr-based oxide. Those skilled in the art will appreciate that these are merely examples and other appropriate oxides can be used. By way of example and not limitation, etch stop capping layer 400 can be deposited with CVD, PVD, or a spin-on process followed by a metal oxide patterning process. A role of etch stop capping layer 400, among others, is to protect conductive material 300 from subsequent etching processes.

In operation 1225, additional via openings and line openings are formed by removing a portion, or all, of mandrels 110, from the pattern structures in predetermined locations according to, for example, an interconnect layout of the integrated circuit being manufactured. Photolithography may be used to define the areas of structure 100 where mandrels 110 are to be removed. A selective etch process removes a portion of the mandrels 110 without removing its corresponding pair of opposing first and second spacers 120 and 122, thus forming an opening (e.g., opening 510 shown in FIG. 5). In some embodiments, a dry etch chemistry can be used to remove mandrels 110. By way of example and not limitation, a dry etch chemistry can be a combination of HBr, He, $O_2$, and $Cl_2$. After removal of mandrels 110, photoresist 500, which was used in the photolithography process, is stripped.

In operation 1230, openings are formed that are self-aligned to the opposing first and second spacers (120 and 122) of the pattern structure. This operation involves similar photolithography and etch processes as described in connection with operation 1215. For example, referring to FIG. 6, photoresist 600 is applied on structure 100 and then patterned. At the end of the photoresist patterning process, via openings 610 are formed in photoresist 600. Some openings, like opening 510 between neighboring spacers 120, are covered by photoresist 600 so that they are not exposed to the etching process.

During this process, the OVL window remains wide. For example, opening 610 has a width 630. In some embodiments, in which the OVL or misalignment error is zero, opening 610 may be as wide as width 620 for at least two reasons: (i) because the via/line opening width is defined by distance 640 between opposing spacers 120 and 122; and (ii) because metal oxide layer 400 protects conductive material 300 from the etching chemistry and therefore if width 630 is wider and includes an area where conductive material 300 is exposed, the conductive material is protected from etching. In some embodiments, the misalignment errors are nonzero and therefore width 630 of opening 610 can be wider than distance 640, but cannot be wider than 620 due to variations in the photolithography process. Hence, the OVL error limits how close width 630 can be to width 620, which is a maximum width without any misalignment errors. This is also true for opening 610.

A selective process removes exposed areas of ILD layer 130 and etch stop layer 140 through photoresist openings 610 to form a via opening that stops on underlying metal layer 150. The photoresist is then stripped. By way of example and not limitation, etch chemistry for the removal of ILD layer 130 may be different than the etch chemistry for stop etch layer 140. In some embodiments, the etch processes are highly selective for ILD layer 130 and etch stop layer 140. An exemplary etch chemistry can include a combination of HBr, He, $O_2$, and $Cl_2$. In some embodiments, the etch process is timed, end-pointed, or a combination of the two. For example, an etch process is timed in the beginning of the process and end-pointed towards the end of the process.

In operation 1235, another conductive material fills the second opening(s) to form an additional interconnect layer that includes conductive structures. In FIG. 7, a conductive material 700 fills via openings 610 and line openings 510. In some embodiments, opening 510 is a line opening, and the height of via opening 610 is larger than the height of line opening 510. In some embodiments, via and line openings 610 and 510 when filled with a conductive material form conductive structures in an interconnect layer. In some embodiments, conductive material 700 is different than conductive material 300. In some embodiments, conductive material 700 is Al, Co, Cu, graphene, or any suitable conductive material with appropriate resistivity. In FIG. 8, conductive material 700 is polished with CMP down to the level of metal oxide layer 400. In some embodiments, excess conductive material 700 is etched with a metal etch process. In some embodiments, the excess conductive material 700 can be removed with a combination of CMP and dry etch. In the CMP and dry etch case, conductive material can be recessed below the metal oxide layer 400. Once conductive material is polished or etched, its top surface is capped with an etch stop capping layer 800. In some embodiments, lines or vias with different conductive material 300 and 700 are alternating. Conductive material 300 and 700 are alternating may have different selectively grown etch stop capping layers. In some embodiments, like etch stop capping layer 400, etch stop capping layer 800 is selectively grown on conductive material 700. By way of example and not limitation, etch stop capping layer 800 can be a metal oxide such as, for example, an Al-based, a Co-based, a W-based, a nickel Ni-based, or a Zr-based oxide. Those skilled in the art will appreciate that these are merely examples and other appropriate oxides can be used. By way of example and not limitation, etch stop capping layer 400 can be deposited with CVD, PVD, or a spin-on process followed by a metal oxide patterning process.

In step 1240 opening are formed by removing the opposing first and second spacers 120, 122 and the remaining mandrels 110 to form openings to be filled with a dielectric liner layer. In some embodiments, spacers 120, 122 can be removed with a dry etch process or a wet etch process. By way of example and not limitation, a dry etch chemistry can be fluorine-based ($C_xH_yF_z$) or chlorine-based ($Cl_2$, $B_xCl_y$). An exemplary wet etch chemistry can be hydrochloric acid, phosphoric acid, nitric acid, and hydrogen peroxide chemistry.

In step 1245, the openings are filled with a dielectric liner layer where voids are being formed between the conductive structures. For example, referring to FIG. 10, a dielectric liner layer 1000 covers the etch stop capping layers 800, 400 and partially fills the space between the formed interconnects (conductive material 300 and 700) allowing for a void 1010 to be formed between the interconnects. Void 1010 may be referred to as an "air-gap." In some embodiments, void 1010 contains a gas. In some embodiments, void 1010 is nominally gas free. Voids can have a dielectric constant of nearly 1, therefore increasing the size of the void can further lower the dielectric constant of dielectric liner material 1000. In some embodiments, the dielectric constant of dielectric liner layer 1000 with voids present can range from 2 to 6. In some embodiments, dielectric liner layer 1000 is deposited using a CVD or an ALD process. The deposition process conditions and the size of the available space between the interconnects can modulate the size of the void. Process conditions such as pressure and gas ratios can affect the conformality of the deposited dielectric liner layer and allow the void to be formed. In some embodiments, the line spacing can range from 5 to 20 nm. At this line spacing range, the void forms naturally and can occupy anywhere from 30 to 70% of the total volume between conductive materials 700 and 300. Dielectric liner layer 1000 can be $SiO_2$, SiN, or SiC and its thickness can range from 10 to 100 nm. Due to voids 1010 present in dielectric liner layer 1000, this layer does not have the thermo-mechanical rigidity to sustain vibrations or mechanical/thermal stress from subsequent processing. In some embodiments, a dielectric liner layer cap is used to protect dielectric liner layer 1000 from fracture and/or collapse.

In step 1250, a dielectric cap layer is formed over the liner dielectric layer. Referring to FIG. 11, a dielectric layer cap 1100 is spin-coated or deposited with CVD over dielectric liner layer 1000. In some embodiments, dielectric layer cap 1100 is a low-k layer that provides mechanical support to dielectric liner layer 1000. In some embodiments, the thickness of dielectric liner layer 1000 is between 10 and 100 nm with a dielectric constant between 2 and 6.

An interconnect formation process that employs a patterning photolithography/etch process with self-aligned interconnects is disclosed to improve the photolithography OVL margin since alignment is accomplished on a wider pattern. A wider OVL window reduces wafer defectivity associated with patterning such as, for example, metal bridges and deformed interconnects.

Patterning defects are a reliability concern which adversely impacts wafer yield. In addition, the patterning photolithography/etch process with self-aligned interconnects supports the use of a multi-metal gap fill process where the interconnects can be filled with different types of conductive material. The multi-metal gap-fill process utilizes a selective metal oxide that is grown after a fill process to protect a deposited metal from subsequent etch processes. In some embodiments, dielectric liner layer is formed between the interconnects. The liner dielectric layer includes voids, or "air-gaps", in the space between the formed interconnects. The voids, or "air-gaps," further lower the dielectric constant of the liner dielectric layer. A dielectric cap layer is formed over the dielectric liner layer to protect the dielectric liner layer from fracture and/or collapse.

In some embodiments, a semiconductor fabrication method includes a substrate, a dielectric stack formed over the substrate. A first interconnect layer made of a first conductive material and a second interconnect layer made of a second conductive material formed on a dielectric stack. The first and second conductive materials are different from one another. A first metal oxide layer is formed on the first interconnect layer and a second metal oxide layer is formed on the second interconnect layer. A first dielectric layer which includes a void is formed between the first and second interconnect layers and over the first and second metal oxides layers. A second dielectric layer is formed over the first dielectric layer.

In some embodiments, a semiconductor fabrication method includes a substrate and a dielectric stack formed over the substrate. A first interconnect layer and a second interconnect layer are formed with at least one of the first and second interconnect layers disposed in the dielectric stack. An opening is formed between the first and second interconnect layers. A first dielectric layer that includes an opening is disposed in the opening. A second dielectric layer is formed over the first dielectric layer.

In some embodiments, a semiconductor device includes a substrate and a dielectric stack over the substrate. A first dielectric layer over the dielectric stack and a second dielectric layer over the first dielectric layer. A first conductive structure embedded in the first dielectric layer, where the first conductive structure forms a first interconnect layer with a first conductive material and a first portion that penetrates through the dielectric stack. A second conductive structure is embedded in the first dielectric layer, where the second conductive structure forms a second interconnect layer with a second conductive material and a second portion that penetrates through the dielectric stack. The first dielectric layer includes a void formed between the first and second conductive structures.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A semiconductor fabrication method, comprising:
   providing a substrate;
   forming a dielectric stack over the substrate;
   forming a first metal layer and a second metal layer on the dielectric stack, wherein:

the first and second metal layers comprise different metallic materials from one another; and a first top surface of the first metal layer is substantially coplanar with a second top surface of the second metal layer:

forming a first metal oxide layer on the first metal layer and a second metal oxide layer on the second metal layer;

forming a first dielectric layer in contact with each side surface of the first and the second metal layers and over the first and second metal oxides layers, wherein the first dielectric layer comprises a void; and forming a second dielectric layer over the first dielectric layer.

2. The method of claim 1, further comprising:
forming at least one transistor with one or more contact metal layers over the substrate;
forming an interconnect layer over the one or more contact metal layers;
forming the dielectric stack over the interconnect layer.

3. The method of claim 1, wherein the forming the first and second metal layers comprises:
forming a first pattern structure and a second pattern structure over the dielectric stack, wherein each of the first and second pattern structures comprises a first spacer, a second spacer, and a center portion between the first and second spacers;
depositing a first metallic material between the first and second pattern structures; and
removing a portion the first metallic material to form the first metal layer, wherein the first top surface of the first metal layer is substantially coplanar with third top surfaces of the first and the second pattern structures.

4. The method of claim 3, further comprising:
removing the center portion of the second pattern structure between the first and second spacers;
depositing a second metallic material between the first and the second spacers of the second pattern structure; and
removing a portion of the second metallic material to form the second metal layer, wherein the second top surface of the second metal layer is substantially coplanar with fourth top surfaces of the first and the second spacers of the second pattern structure.

5. The method of claim 1, wherein the metallic materials of the first and second metal layers comprise copper, cobalt, aluminum, or graphene.

6. The method of claim 1, wherein the forming of the first and the second metal oxide material layers comprises selectively growing aluminum-based oxides, tungsten-based oxides, nickel-based oxides, zirconium-based oxides, or cobalt-based oxides on the first and the second metal layers.

7. The method of claim 1, wherein the forming the first metal oxide layer on the first metal layer and the second metal oxide layer on the second metal layer comprises:
forming a pattern structure between the first and the second metal layers; and
growing the first oxide layer on the first top surface of the first metal layer; while exposing a third top surface of the pattern structure; and
growing the second metal oxide layer on the second top surface of the second metal layer, while covering the first top surface of the first metal layer with the first metal oxide layer and exposing the third top surface of the pattern structure.

8. A semiconductor fabrication method, comprising:
providing a substrate;
forming a dielectric stack over the substrate; and
forming a first interconnect layer and a second interconnect layer, comprising:
forming a first pattern structure and a second pattern structure over the dielectric stack, wherein each of the first and second pattern structures comprises a first spacer, a second spacer, and a center portion between the first and second spacers;
depositing a first conductive material and a metal oxide layer between the first and second pattern structures to form the first interconnect layer, wherein a bottom surface of the metal oxide layer is above both a first top surface of the first pattern structure and a second top surface of the second pattern structure;
removing the center portion of the second pattern structure between the first and second spacers; and
depositing a second conductive material between the first and second spacers of the second pattern structure to form the second interconnect layer.

9. The method of claim 8, further comprising:
forming at least one transistor with one or more contact metal layers over the substrate;
forming another interconnect layer over the one or more contact metal layers; and
forming the dielectric stack over the another interconnect layer.

10. The method of claim 8, wherein the depositing the first conductive material and the metal oxide layer comprises:
forming an opening in the dielectric stack, wherein the opening self-aligns to the first and second pattern structures;
depositing the first conductive material in the opening;
removing a portion of the first conductive material to form a first conductive structure, wherein a third top surface of the first conductive structure is substantially coplanar with both the first top surface of the first pattern structure and the second top surface of the second pattern structure; and
selectively growing the metal oxide layer on the third top surface of the first conductive structure.

11. The method of claim 8, wherein the depositing the second conductive material comprising:
forming an opening in the dielectric stack, wherein the opening self-aligns to the first and second spacers of the second pattern structure;
depositing the second conductive material in the opening;
removing a portion of the second conductive material to form a second conductive structure, wherein a third top surface of the second conductive structure is substantially coplanar with fourth top surfaces of the first and the second spacers of the second pattern structures, wherein the second conductive material is different from the first conductive material; and
selectively growing an other metal oxide layer on the third top surface of the second conductive structure.

12. The method of claim 8, further comprising:
forming an opening between the first and second interconnect layers;
disposing a first dielectric layer in the opening, wherein the first dielectric layer comprises a void; and
forming a second dielectric layer over the first dielectric layer.

13. The method of claim 8, wherein the depositing the second conductive material comprises depositing the second conductive material over the center portion of the first pattern structure.

14. The method of claim 8, wherein the removing the center portion of the second pattern structure comprises covering the center portion of the first pattern structure with a mask layer.

15. A semiconductor device fabrication method, comprising:
   providing a substrate;
   forming at least one transistor with one or more contact metal layers over the substrate;
   forming an interconnect layer over the one or more contact metal layers;
   forming a first and a second plurality of pattern structures over the interconnect layer;
   forming a first conductive layer between each of the first and the second plurality of pattern structures;
   masking the second plurality of pattern structures;
   forming an opening in each of the first plurality of pattern structures while the second plurality of pattern structures are masked; and
   forming a second conductive layer in the opening of each of the first plurality of pattern structures.

16. The method of claim 15, wherein the forming the first and the second plurality of pattern structures over the interconnect layer comprises:
   forming a dielectric stack over the interconnect layer;
   forming a plurality of hard-mask structures over the dielectric stack; and
   forming spacers adjacent to each of the plurality of hard-mask structures.

17. The method of claim 15, wherein the forming the opening in each of the first plurality of pattern structures comprises:
   forming spacers adjacent to each of the first and the second plurality of pattern structures;
   exposing the first plurality of pattern structures while the second plurality of pattern structures are masked; and
   selectively removing the first plurality of pattern structures from the spacers adjacent to each of the first plurality of pattern structures.

18. The method of claim 15, wherein the forming the first and the second conductive layers comprises:
   depositing a first conductive material between each of the first and the second plurality of pattern structures and a second conductive material in the opening of each of the first plurality of pattern structures; and
   removing a portion of the second conductive material to level with the first conductive material.

19. The method of claim 15, further comprising forming first and second metal oxides over the first and second conductive layers, respectively, via a chemical vapor deposition (CVD), physical vapor deposition (PVD), or a spin-on process.

20. The method of claim 15, further comprising:
   removing the second plurality of pattern structures;
   forming a first dielectric layer between the first and the second conductive layers; and
   forming a second dielectric layer over the first dielectric layer and the first and the second conductive layers.

* * * * *

UNITED STATES PATENT AND TRADEMARK OFFICE
CERTIFICATE OF CORRECTION

PATENT NO. : 10,534,273 B2
APPLICATION NO. : 15/586881
DATED : January 14, 2020
INVENTOR(S) : Yang et al.

Page 1 of 1

It is certified that error appears in the above-identified patent and that said Letters Patent is hereby corrected as shown below:

In the Claims

In Column 13, Claim 1, Line 5, "layer:" should be "layer;".

Signed and Sealed this
Thirty-first Day of March, 2020

Andrei Iancu
*Director of the United States Patent and Trademark Office*